United States Patent
Ashida

(10) Patent No.: US 7,195,948 B2
(45) Date of Patent: Mar. 27, 2007

(54) METHOD FOR FABRICATING SEMICONDUCTOR DEVICE

(75) Inventor: Tsutomu Ashida, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 224 days.

(21) Appl. No.: 10/498,373

(22) PCT Filed: Dec. 10, 2002

(86) PCT No.: PCT/JP02/12938

§ 371 (c)(1),
(2), (4) Date: Sep. 9, 2004

(87) PCT Pub. No.: WO03/054935

PCT Pub. Date: Jul. 3, 2003

(65) Prior Publication Data

US 2005/0009222 A1    Jan. 13, 2005

(30) Foreign Application Priority Data

Dec. 10, 2001    (JP)    ............................. 2001-376014

(51) Int. Cl.
*H01L 21/00*    (2006.01)
*H01L 31/0232*    (2006.01)
*H01L 31/0203*    (2006.01)
*H01L 25/16*    (2006.01)

(52) U.S. Cl. .................... 438/64; 438/66; 438/67; 257/432; 257/433; 257/434; 257/E25.032

(58) Field of Classification Search ................ 438/64, 438/66–67; 257/431–434, E25.032
See application file for complete search history.

(56) References Cited

U.S. PATENT DOCUMENTS 5,334,829 A    8/1994    Ueno et al.
6,046,070 A *  4/2000    Shoji et al. ............... 438/66

FOREIGN PATENT DOCUMENTS

| JP | 61-013652 | 1/1986 |
| JP | 05-206423 | 8/1993 |
| JP | 08-018025 | 1/1996 |
| JP | 09-135011 | 5/1997 |
| JP | 2001-250188 | 9/2001 |

OTHER PUBLICATIONS

Translation of the International Preliminary Examination Report mailed Mar. 22, 2004 in corresponding PCT Application No. PCT/JP2002/012938.

* cited by examiner

*Primary Examiner*—Luan Thai
(74) *Attorney, Agent, or Firm*—Nixon & Vanderhye P.C.

(57) ABSTRACT

A method for fabricating a semiconductor device, comprising the steps of: forming an element on a silicon substrate; packaging the element; and annealing the packaged element before its transportation or long-term storage.

9 Claims, 6 Drawing Sheets

FLOWCHART FOR
PRESENT INVENTION

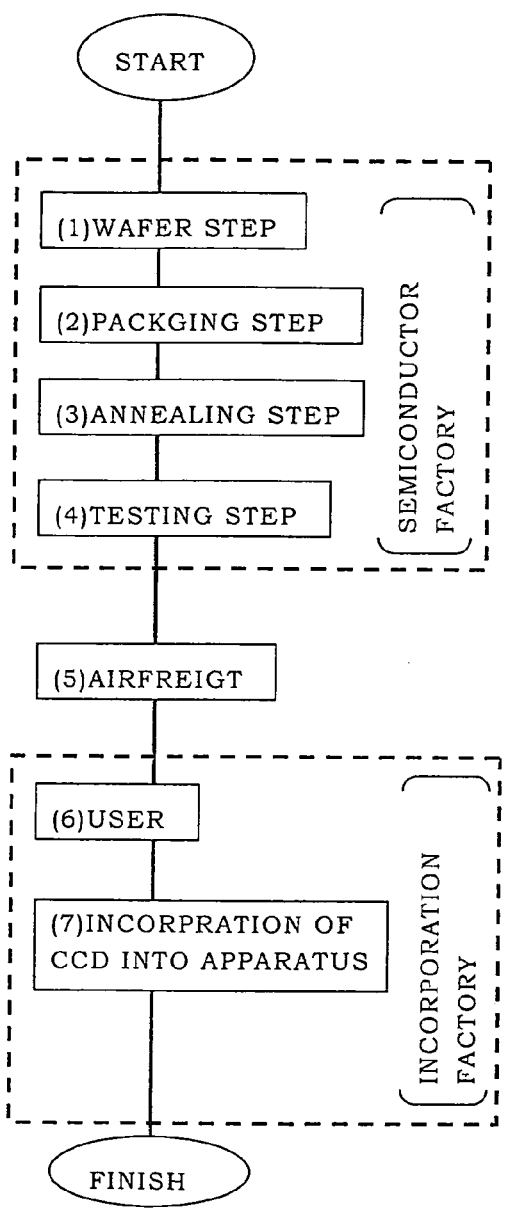
FLOWCHART FOR
PRESENT INVENTION
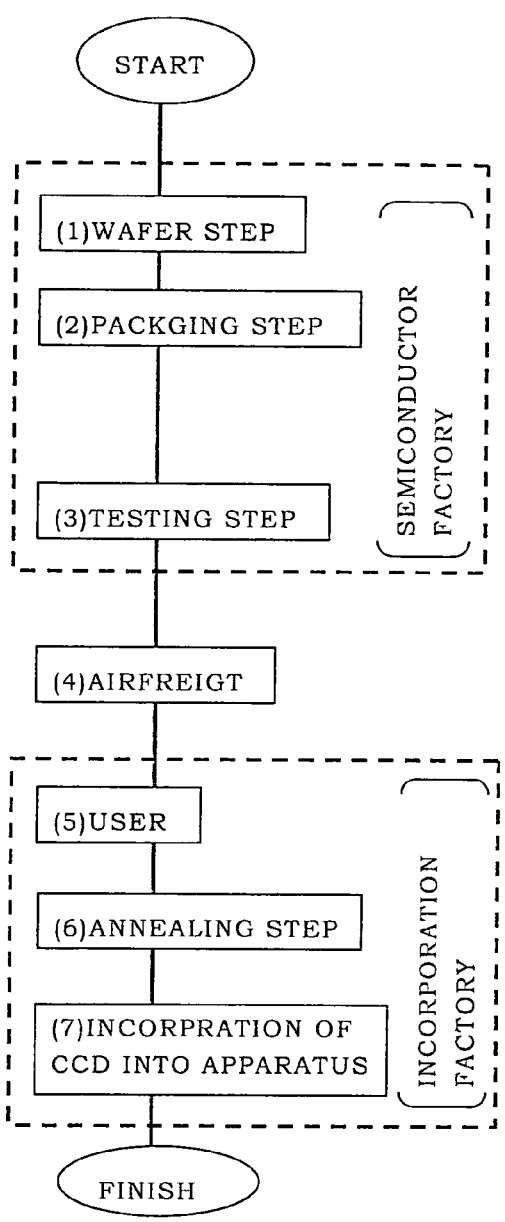
FLOWCHART FOR
PRIOR ART

METHOD FOR FABRICATING SEMICONDUCTOR DEVICE

This application is the US national phase of international application PCT/JP02/12938 filed 10 Dec. 2002, which designated the US. PCT/JP02/12938 claims priority to JP Application No. 2001-376014 filed 12 Dec. 2001. The entire contents of these applications are incorporated herein by reference.

TECHNICAL FIELD

The present invention relates to a method for fabricating a semiconductor device. More particularly, it relates to a method for fabricating a semiconductor device capable of preventing defects in an element of the semiconductor device while the semiconductor device is being packaged or exposed to an energy beam such as a cosmic ray during transportation or long-term storage.

RELATED ART AND OTHER CONSIDERATIONS

Solid-state image pickup devices as a type of semiconductor device have made striking developments in function and performance such as increase in pixel number. FIG. 1 is a schematic cross section of a pixel of a CCD (charge-coupled device) of a type of solid-state image pickup device to be mounted in a video camera or the like.

As shown in FIG. 1, the CCD is constructed such that pixels each including a pair of a microlense 106 and a photodiode 102 are arranged two-dimensionally on a silicon substrate. In FIG. 1, reference numeral 101 denotes the silicon substrate, 102 a photodiode, 103 a CCD channel, 104 a transfer electrode, 105 a planarization film, and 106 a microlens. Components other than the above shown in FIG. 1 e.g. a light-shielding film and the like are not numbered for the sake of brevity.

An operation principle of the above CCD will now be explained briefly. As a light ray condensed by the microlens 106 enters the photodiode 102, electrons are generated through photoelectric conversion. The generated electrons are accumulated in the photodiode 102. Upon application of a predetermined voltage to the transfer electrode 104 after the lapse of a predetermined accumulation period, the accumulated electrons (charges) are read out into the CCD channel 103. Then, by applying a predetermined pulse voltage to a group of transfer electrodes (not illustrated) arranged perpendicularly to a direction of the paper surface, the electrons are transferred to the group of transfer electrodes. The transferred electrons are converted into a voltage signal by means of another element in a video camera so as to be taken out as an image.

In a process of fabricating a solid-state image pickup device such as a CCD, a trace quantity of impurity such as heavy metal impurity may possibly be mingled in a silicon substrate. The mingled impurity locally forms a defective level in the silicon substrate to increase a dark current which appears itself as a white defect on a display screen. The defective level in the silicon substrate that arises from the fabricating process can be coped with by improving the fabricating process, a treatment condition or the like.

Meanwhile, it is known that, when a CCD is airfreighted particularly via a polar region, typically via the Arctic Circle, the number of white defectes increases by the influence of particles with great energies such as a cosmic ray, an x-ray, a radial ray or the like.

A cause for a white defect is considered to be an increase in interface state at the interface between a silicon substrate and a silicon oxide film. More specifically, electron-hole pairs are generated in a silicon substrate and in a silicon oxide film due to incidence of particles with great energies thereto. Electrons and holes generated in the silicon substrate diffuse in silicon and are recombined and eliminated, thus causing no particular problem. Some of the electron-hole pairs generated in the silicon oxide film, on the other hand, are immediately recombined and eliminated. However, holes with less mobility among the other electron-hole pairs are trapped at a trapping center in the silicon oxide film or move in the film to reach the interface between the silicon substrate and the silicon oxide film, creating a dangling bond in the silicon and thereby increasing interface state. The increase in interface state also is considered to be responsible for the increase in dark current.

For example, in the case where a CCD is incorporated into an apparatus such as a video camera or the like in Japan and thereafter airfreighted to Europe or the like, a defect in the CCD is linked to a defect in a product as a whole in which the CCD is incorporated. Further, even though a white-defect correction-circuit is added to the apparatus to correct the CCD for the defect at the time of incorporation, a new white defect is generated by a cosmic ray when the product is airfreighted to Europe or the like after the CCD is corrected to cause a defect in the whole product in which the CCD is incorporated. Also, in the case where the incorporation of the CCD into the apparatus is made in Europe, even in a CCD shipped as a good one, a defect developed during airfreight causes a defect in the whole product in which the CCD is incorporated.

Japanese Unexamined Patent Publication No. Hei 8(1996)-18025 discloses a technique for rapidly eliminating electron-hole pairs generated in a silicon oxide film to prevent the increase in interface state. FIG. 2 is a schematic cross section of a pixel in a CCD disclosed in the publication.

The CCD of FIG. 2 is different in structure from the typical CCD of FIG. 1 in that a BPSG (Boro-Phospho-Silicate Glass) film 107 containing a significantly high concentration of phosphorus (P) is formed directly below a planarization film 105 to fill recesses formed above photodiodes 102.

The publication describes that the BPSG film with the high content of phosphorus has a high density of recombination centers so that electron-hole pairs generated in a silicon oxide film can be effectively eliminated to reduce the number of holes trapped at a trapping center and thereby to prevent the increase in interface state.

Japanese Unexamined Patent Publication No. 2001-250188 discloses another method in which a transportation route is determined by calculation for minimizing the density of an energy beam among routes between places of dispatch and arrival of a product so that transportation is made in accordance with the given route. Many other methods have been proposed, i.e., one in which a packing material reducing the influence of an energy beam to a minimum is used and another in which a housing of a product is made of a material protective against an energy beam.

In still another proposed method, after being transported, a CCD is subjected to a predetermined thermal treatment (for example, a thermal treatment at 145° C. for about eight hours) before being incorporated into an apparatus to reduce an increased number of white defectes.

The above methods have the following problems.

In Japanese Unexamined Patent Publication No. Hei 8(1996)-18025, the BPSG film needs to contain a concentration of 5 mole % or more of phosphorus ($P_2O_5$) or a concentration of 10 mol % or more of boron ($B_2O_3$) and phosphorus.

It is known that when a PSG (Phospho-Silicate Glass) film or a BPSG film contains a concentration of about 2 mol % or more of phosphorus in a semiconductor integrated circuit, a wiring metal (for example, Al) corrodes by the phosphorus with the lapse of use time.

To prevent this, in the CCD of Japanese Unexamined Patent Publication No. Hei 8(1996)-18025, the PBSG film containing the high concentration of phosphorus is sandwiched between insulating films. However, there is a risk of the phosphorus being leaked when a crack is caused in the insulating film. Also, an additional process is required for depositing/processing the BPSG film.

In such a method as the one disclosed in Japanese Unexamined Patent Publication No. 2001-250188, transportation is made by way of a route minimum in the density of an energy beam to lead the influence of the energy beam to a minimum. The method is less than perfect since the intensity distribution of an energy beam varies every moment.

The method in which the material protective against a cosmic ray is used for the housing itself of the apparatus in which the CCD is incorporated such as a video camera or the like is limited to a particular case due to choice of materials or the like.

The method in which, after being transported, the CCD is subjected to a predetermined thermal treatment before being incorporated into the apparatus requires that equipments such as an oven and a tester, personnel with mastery of operations, and the like should be positioned at the assembly side, incurring extra costs. Also, if performed by the user, the thermal treatment imposes a great deal of inconvenience on the user. Further, it is difficult to install the expensive tester per user and thus to test the CCD after the thermal treatment, giving rise to a problem in quality of the apparatus as a whole in which the CCD is incorporated.

The above influence of an energy beam is exerted not only on a solid-state image pickup device but also on all devices that utilize semiconductors. For example, the above influence of an energy beam is exerted on semiconductor devices such as a memory, a logic, a bipolar and the like to cause device properties degradations such as a leak-current increase.

This means that difficulties are involved in packaging a device such as a CCD in a predetermined manner, incorporating the same into an apparatus such as a video camera or the like and then newly taking a measure against particles with great energy such as a cosmic ray.

BRIEF SUMMARY

As a result of eager study, the present inventor has unexpectedly found a method capable of preventing the influence of an energy beam by a simple technique that does not require that a process of fabricating an element be greatly changed, that special equipment be newly installed, or that transportation routes be individually determined by calculations. Thus, the present invention has been achieved.

In accordance with the present invention, there is provided a method for fabricating a semiconductor device, comprising the steps of: forming an element on a silicon substrate; packaging the element; and annealing the packaged element before its transportation or long-term storage.

BRIEF DESCRIPTION OF DRAWINGS

FIG. 3 is a flowchart for illustrating a method for fabricating a semiconductor device according to an example embodiment;

FIG. 4 is a flowchart for illustrating a conventional method for fabricating a semiconductor device;

DETAILED DESCRIPTION

Figure 1:
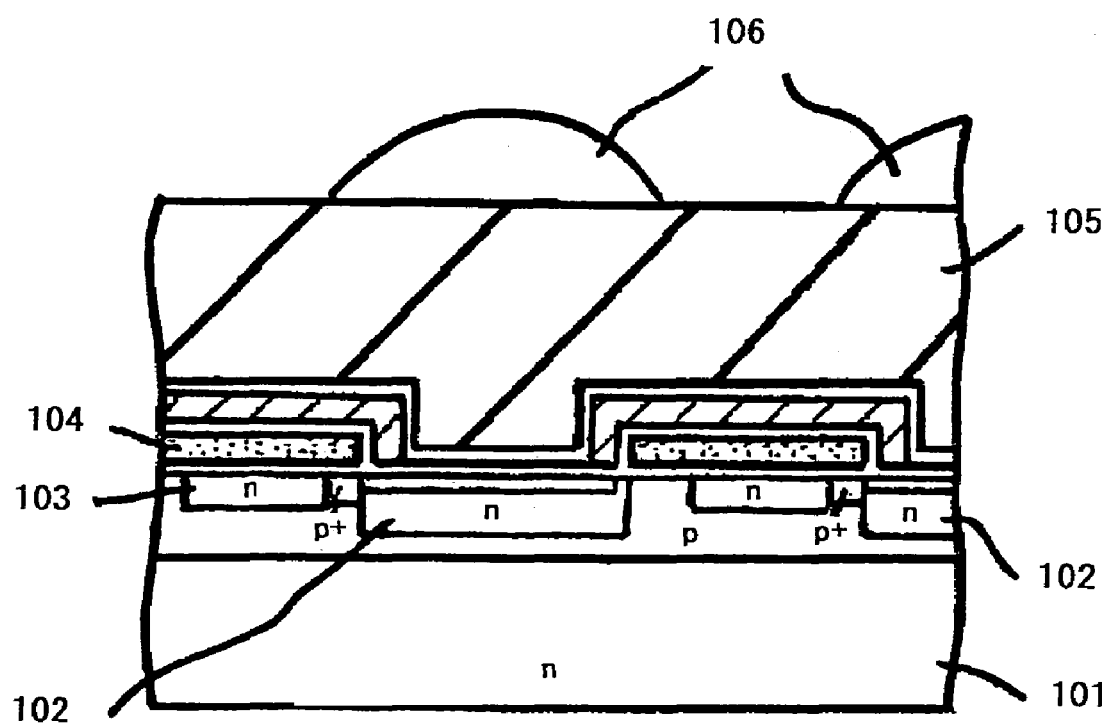
FIG. 1 is a schematic cross section illustrating a structure of a CCD.

One feature of the present invention is to subject a packaged element to a sufficient annealing treatment before its transportation (shipment) to the user or before its long-term storage to reduce the number of defects such as white defects generated in a semiconductor device during transportation or packaging thereof.

Causes for a white defect are considered to be:

(1) An increase in trapping center density in a silicon oxide film or an increase in interface state between silicon/ the silicon oxide film during packaging of a semiconductor device due to contamination with impurities such as heavy metal impurities which arise from a seal material, an atmosphere or the like, water adsorption, and stress applied in die bonding and (2) Trapping of holes with less mobility among electrons/ holes generated in the silicon and in the silicon oxide film during exposure of the semiconductor device to an energy beam such as a cosmic ray. In accordance with an example embodiment, the annealing treatment is carried out to reduce the trapping center density in the silicon oxide film and the interface state at the silicon/the silicon oxide film and thereby to suppress the increase in leak current.

Consequently, it is possible to suppress the occurrence of defects such as white defects resulting from a leak current caused by changes with time after shipment and caused by an ionization damage from exposure to an energy beam.

The element according to the present invention is not particularly limited. Examples of the element include solid-state image pickup devices such as a CCD and a CMOS imager where prevention of white defects is expected, semiconductor devices such as a memory, a logic and bipolar where prevention of properties degradations such as a leak current increase is expected, and modules in which these are contained.

The present invention is preferably applied, among the above elements, to solid-state image pickup devices such as a CCD and a CMOS imager where a white defect resulting from energy exposure occurs and outstanding degradations with time are observed. Examples of the solid-state image pickup device include a CCD of the same structure as the structures of the conventional CCDs shown in FIGS. 1 and 2.

A method for fabricating the element is not-particularly limited. For example, a known method may be used comprising the wafer steps of forming a plurality of element on a silicon wafer and sectioning the silicon wafer into chips by dicing.

Then, the sectioned elements in the form of chips are each packaged. In the packaging step, which is not particularly limited, any known material and method may be used. Examples of the materials of constitution of a package include ceramics and plastics. Preferably, a material with a low radiant density of an alpha ray is used.

Further, the element is subjected to an annealing treatment. The annealing treatment is preferably carried out under the temperature and time at which the annealing treatment does not affect the element or package.

After the annealing treatment, the semiconductor device is tested, stored for an arbitrary term, and transported to the user, by whom the semiconductor device is then incorporated into an apparatus. In accordance with the present invention, since the annealing treatment has suppressed the occurrence of defects, an annealing treatment and a testing by the user can be omitted.

Hereafter, referring to a drawing, an explanation will be given to a case where the element is a CCD.

FIG. 3 shows a procedure followed by the present invention of from production of a wafer for a CCD to incorporation of the CCD into an apparatus at the user side.

In a wafer step (1), a wafer having CCDs formed thereon is sectioned into chips each having a CCD. Next, in a packaging step (2), each chip is mounted in a package made of ceramics or a plastic.

Though the packaging is performed with sufficient care paid to water and to contamination with impurities (such as heavy metal impurities), the influence thereof cannot completely be reduced to zero. Also, stress applied to the chips in die bonding or the like during the packaging is difficult to avoid. The water, contamination and stress may possibly cause changes with time after a semiconductor device is shipped to a factory by forming a trap level in a silicon oxide film and an interface state at the interface between a silicon substrate/the silicon oxide film.

Especially for a shipment to the user abroad, airfreight is required in many cases because the time to deliver is short. Holes with less mobility among electron-hole pairs generated in the silicon oxide film due to exposure to an energy beam during airfreight are trapped at a trapping center in the silicon oxide film or move in the film to reach the interface between the silicon substrate and the silicon oxide film, creating a dangling bond in the silicon and thereby increasing interface state. The increase in interface state leads to the increase in leak current and thus to the increase in the number of white defects.

In accordance with the present technology, it is preferable that, after the packaging, a sufficient annealing should be performed in an annealing step (3) at a temperature ranging from 100° C. to the heat resistant temperature of materials used in the solid-state image pickup device and in the package for about one hour to 200 hours. This makes it possible not only to reduce a leak current arising from water and impurities such as heavy metal but also to eliminate a trap level formed in the silicon oxide film and an interface state formed at the interface between the silicon substrate/the silicon oxide film. Annealing at a higher temperature for a longer time produces a higher effect. The upper limit temperature can be properly set depending on the heat resistances of a color filter, a lens, a package and a seal material of a CCD. A more specific temperature range is 100 to 300° C.

In the case of a plastic package, a microlens of the CCD may possibly melt or a package seal may possibly peel by the influence of water contained in the package when the temperature is quickly raised to 140° C. or more. To prevent this, it is preferable that first, the package be dried at a temperature of about 70 to 100° C. and next, annealing is performed at a temperature ranging from 140° C. to the heat resistant temperature of the materials used in the CCD and in the package.

The packaging step and the annealing step are preferably performed sequentially.

Also, it is preferable that a testing step (4) should follow the annealing step (3). The testing step is not particularly limited, and any known testing step may be used.

The semiconductor device, in which the trap level and interface state have been substantially eliminated by the annealing, is then transported by airfreight (5) or the like to the user. Accordingly, the holes with less mobility among the electron-hole pairs generated in the silicon oxide film due to exposure of the semiconductor device to an energy beam can be eliminated without being trapped to prevent white defects which are otherwise generated after incorporation of the CCD into an apparatus (7) by the user (6).

Meanwhile, the shift of a coloring material for the color filter from a pigment to a dye, the covering of a microlens with an inorganic material, the improvement in an epoxy resin as a seal material, and the employment of cement as the seal material have been made to realize a heat resistant temperature of about 200° C. and further to raise the possibility of an annealing treatment at 300° C. Performing an annealing treatment at a higher temperature for a longer period will be able to enhance the effect of the present invention.

Hereafter, the effect of the present invention will be explained in detail.

Figure 2:
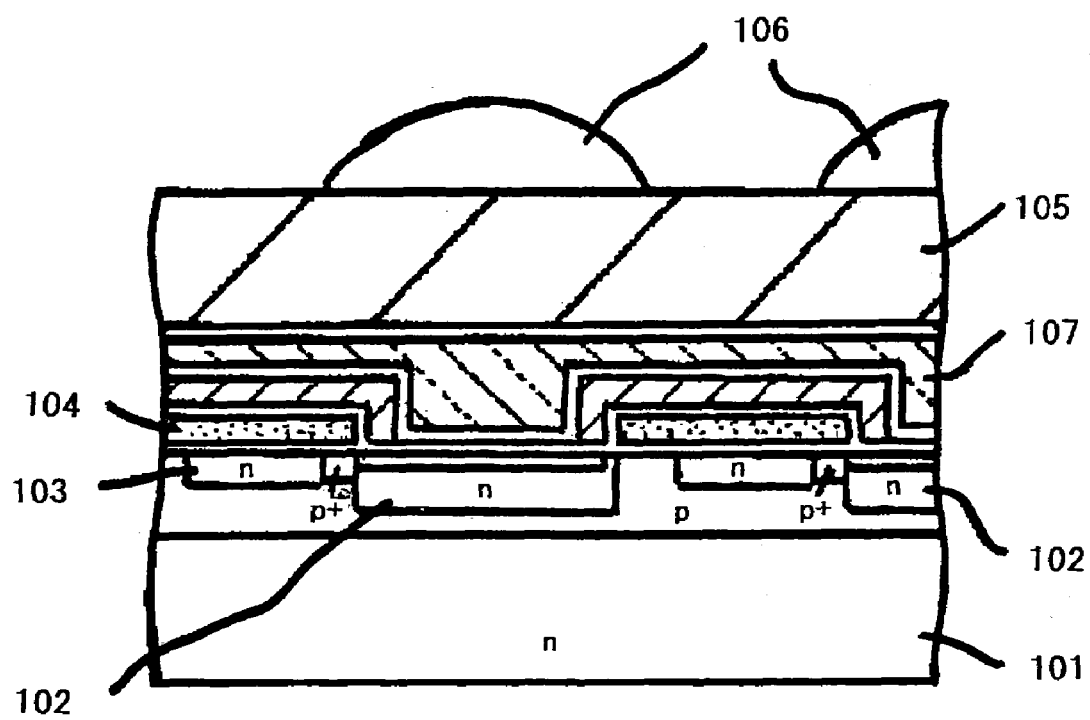
FIG. 2 is a schematic cross section illustrating a structure of another CCD.
Figure 5:
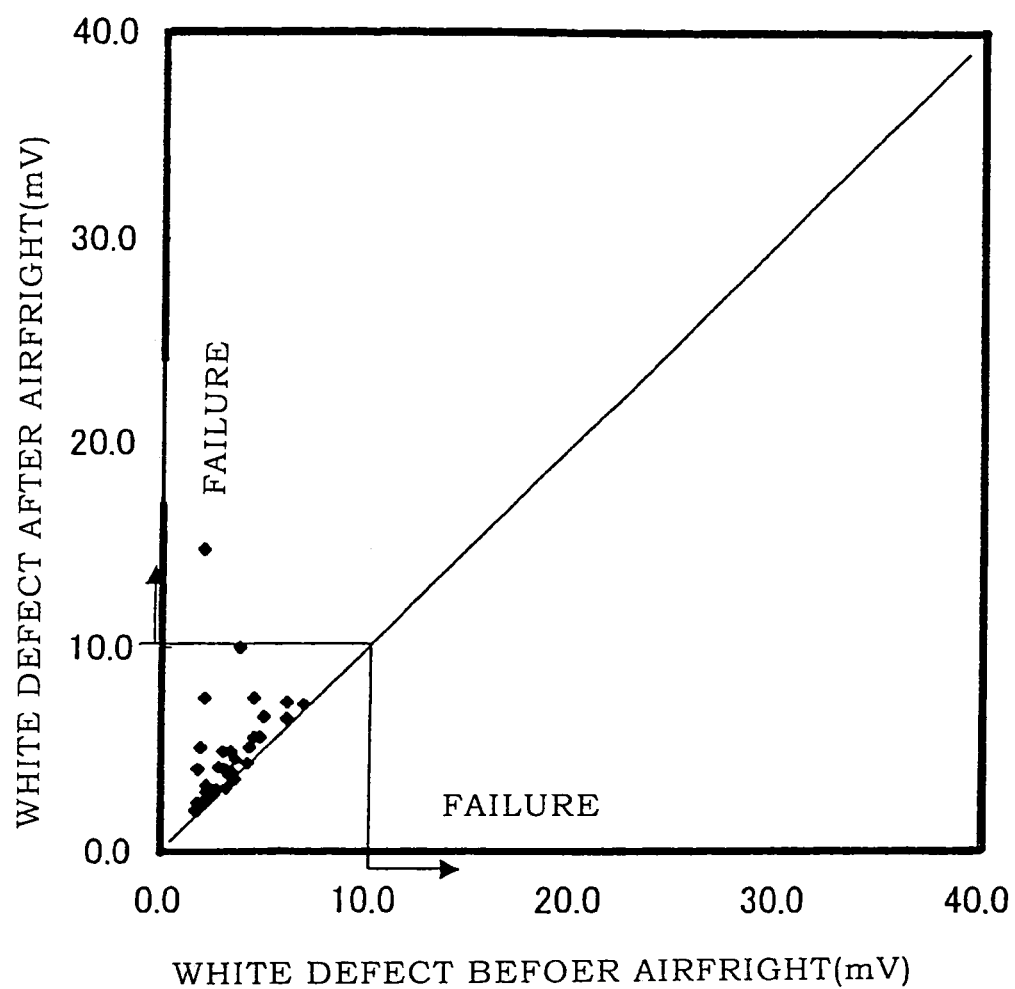
FIG. 5 is a graph showing a change in the number of white defectes, before and after airfreight, in forty semiconductor devices packaged and then annealed at 145° C. for 100 hours.

Forty semiconductor devices, one of which is shown in FIG. 1, were packaged and annealed at 145° C. for 100 hours, followed by a trip from Japan to Germany by airplane. FIG. 5 shows a change in the number of white defects in the semiconductor devices after the trip.

It is understood from FIG. 5 that though the white defect level slightly increased in the annealed semiconductor devices, only one was found failed out of the forty semiconductor devices with a degradation rate of 2.5%.

Figure 6:
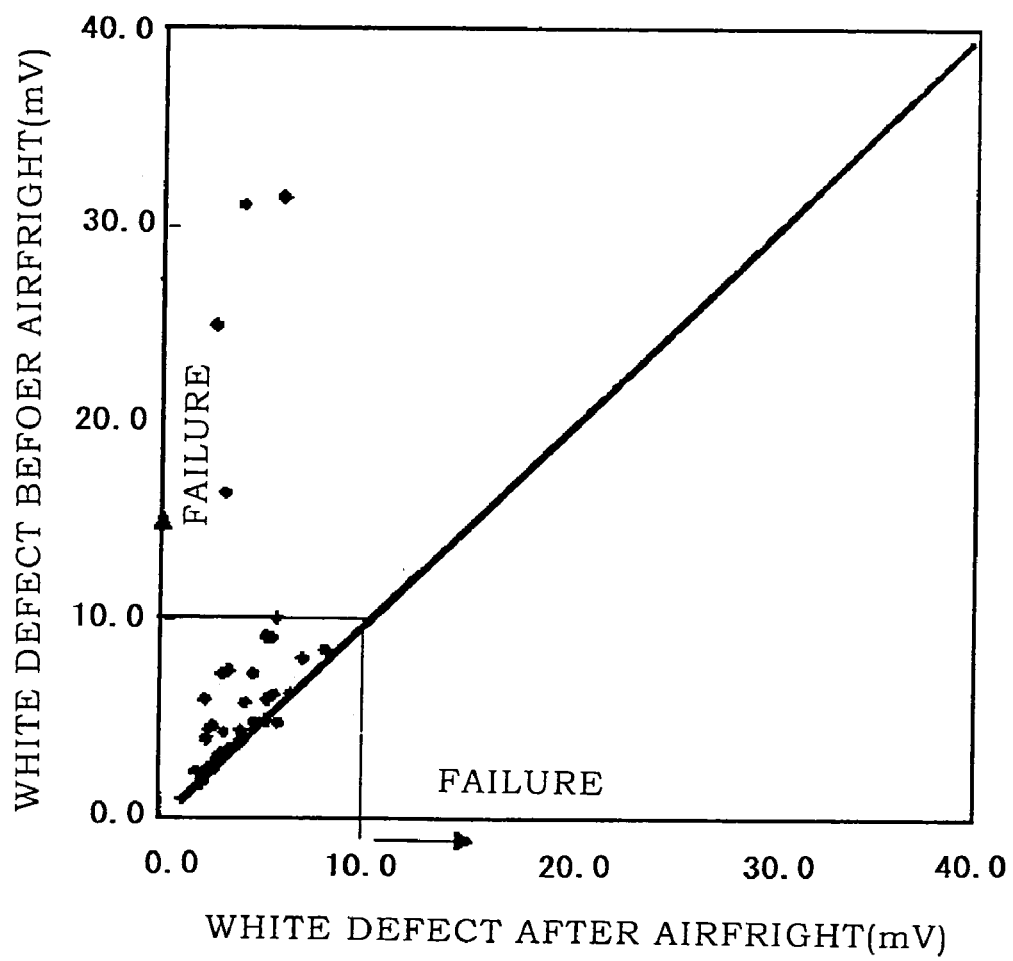
FIG. 6 is a graph showing a change in the number of white defectes, before and after airfreight, in fifty semiconductor devices packaged but not annealed at 145° C.

FIG. 6 shows a change in the number of white defects in fifty unannealed semiconductor devices, one of which is shown in FIG. 1, after a trip from Japan to Germany.

It is understood from FIG. 6 that the white defect level significantly increased in four out of the fifty unannealed semiconductor devices with a degradation rate as high as 8%. This indicates that annealing can prevent white defectes resulting from exposure to a cosmic ray in a semiconductor device.

Figure 7:
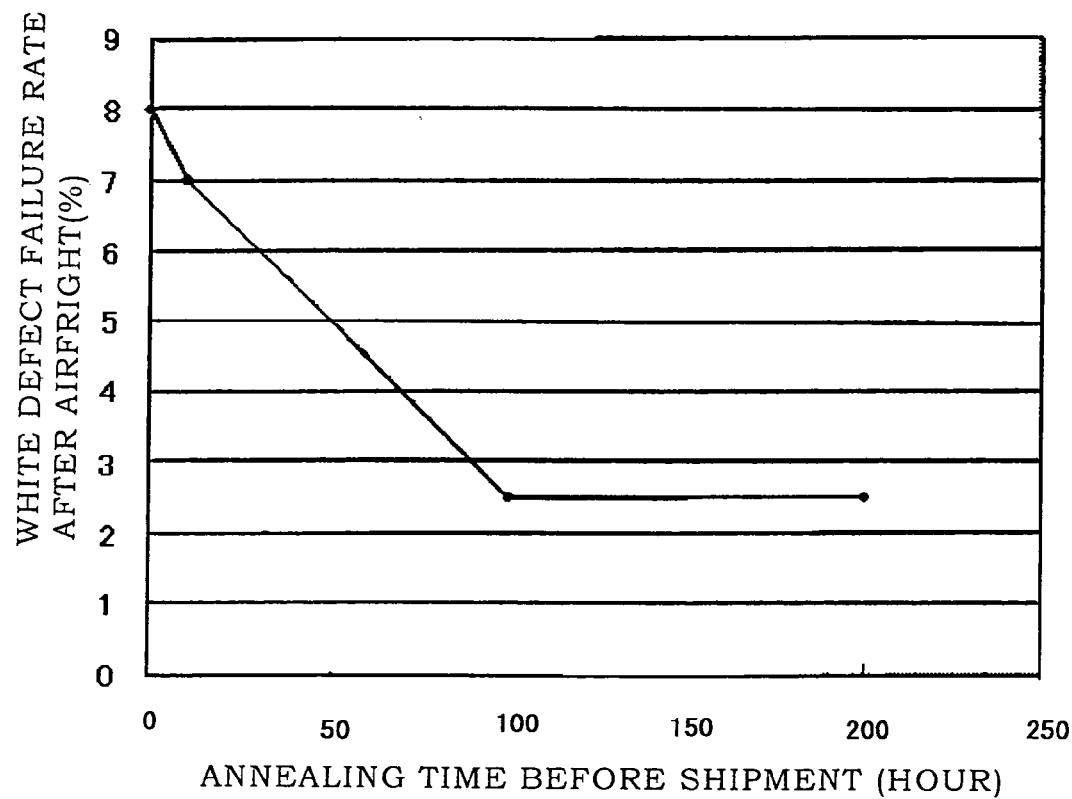
FIG. 7 is a graph showing the white-defect failure rates, after airfreight, of sets of semiconductor devices (each set made up of fifty) annealed at 145° C. under the condition that the annealing time is changed for each set within the range of 0 and 200 hours.

FIG. 7 shows the white-defect failure rate, after airfreight, of sets of semiconductor devices (each set made up of fifty) annealed at a temperature of 145° C. under the condition that the annealing time is changed for each set within the range of 0 and 200 hours. In FIG. 7, a product at a zero annealing time corresponds to an unannealed product. The airfreight was made under the condition of a trip from Japan to Germany by airplane.

It is understood in FIG. 7 that even annealing at 145° C. for 10 hours can prevent white defects and that annealing at 100 hours or more can prevent white defects more effectively.

FIG. 4 is a prior art procedure. An annealing step (6) is carried out by the user (5) or by a local branch office or agent after airfreight (4). For example, annealing at 145° C. for about 8 hours has been generally performed because of constraints of facilities. This means that though a limited effect is produced in terms of elimination of a trap level and an interface state, no sufficient annealing has been performed. In accordance with the present invention, in which a large number of semiconductor devices can be annealed all at once in a semiconductor factory, the constraints of facilities are reduced to make it possible to perform sufficient annealing within the range of the heat resistant temperatures of materials. Also, in prior arts in which after undergoing device processes, a semiconductor device is subjected to an annealing treatment outside a semiconductor factory and incorporated into an apparatus without being retested, there is a risk that a semiconductor device with a failure generated in the annealing treatment might be incorporated into the apparatus, while in the present invention, it is possible to avoid the risk.

As has been described above, in accordance with the present invention, an element packaged in advance such as a CCD is subjected to sufficient annealing and then tested immediately before its shipment to the user.

For this reason, the present invention can reduce a surface leak current caused by contamination with impurities such as heavy metal which arise from a seal material, water absorption, and stress applied in die bonding or the like during packaging. Thereby, the present invention can prevent defects such as white defectes generated from the surface leak current. Further, the present invention can reduce trapping center density in the silicon oxide film and interface state at the silicon substrate/silicon oxide film to control the increase in dark current caused by trapping of holes with less mobility among electron/holes generated in the silicon oxide film due to exposure of the semiconductor device to a beam with great energy.

Consequently, the present invention, in which the element packaged in advance is subjected to sufficient annealing before being shipped to the user, can suppress the occurrence of defects such as white defectes resulting from the leak current caused by changes with time and caused by ionization damage from exposure to an energy beam.

The invention claimed is:

1. A method for fabricating a semiconductor device, comprising the steps of:
   forming an element on a silicon substrate;
   packaging the resulting element;
   driving the package element at 50° C. to 140° C. and then annealing it at 100° C. to 300° C. before its transportation or long-term storage;
   testing the annealed packaged element;
   transporting or long-term storing the tested packaged element; and
   incorporating the transported or long-term stored packaged element into a device without annealing.

2. The method for fabricating a semiconductor device according to claim 1, wherein the element is a CCD or a CMOS imager.

3. The method for fabricating a semiconductor device according to claim 1, wherein the annealing is performed at a temperature ranging from 100° C. to a heat resistant temperature of materials used in the element and in a package for 1–200 hours.

4. The method for fabricating a semiconductor device according to claim 3, wherein the annealing is performed at a temperature of 100–300° C.

5. The method for fabricating a semiconductor device according to claim 1, wherein a package is dried at a temperature of 50–140° C. before the annealing.

6. The method for fabricating a semiconductor device according to claim 5, wherein the drying is performed for 20–120 minutes.

7. The method for fabricating a semiconductor device according to claim 6, wherein the annealing is performed at a temperature ranging from 100° C. to a heat resistant temperature of materials used in the element and in a package for 1–200 hours.

8. The method for fabricating a semiconductor device according to claim 7, wherein the annealing is performed at a temperature of 100–300° C.

9. The method for fabricating a semiconductor device according to claim 1, wherein the packaging step and the annealing step are performed sequentially.

* * * * *